United States Patent
Kraft et al.

(10) Patent No.: US 9,907,181 B2
(45) Date of Patent: Feb. 27, 2018

(54) ELECTRONIC MODULE

(71) Applicant: HARMAN BECKER AUTOMOTIVE SYSTEMS GMBH, Karlsbad (DE)

(72) Inventors: Guenther Kraft, Karlsruhe (DE); Krunoslac Orcic, Karlsruhe (DE); Didier Berthomier, Villingen-Schwenningen (DE); Thomas Schiemann, Karlsruhe (DE); Valod Noshadi, Ettlingen (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 5 days.

(21) Appl. No.: 14/909,180

(22) PCT Filed: Jul. 3, 2014

(86) PCT No.: PCT/EP2014/064129
§ 371 (c)(1),
(2) Date: Feb. 1, 2016

(87) PCT Pub. No.: WO2015/014563
PCT Pub. Date: Feb. 5, 2015

(65) Prior Publication Data
US 2016/0174382 A1     Jun. 16, 2016

(30) Foreign Application Priority Data

Jul. 30, 2013    (EP) .................... 13178585

(51) Int. Cl.
*H05K 1/18*    (2006.01)
*H01L 23/38*    (2006.01)
(Continued)

(52) U.S. Cl.
CPC ............ *H05K 1/185* (2013.01); *H01L 23/38* (2013.01); *H01L 23/5383* (2013.01);
(Continued)

(58) Field of Classification Search
CPC .......... H01L 23/38; H01L 2224/32145; H01L 23/49822; H05K 1/185
See application file for complete search history.

(56) References Cited

U.S. PATENT DOCUMENTS 6,094,919 A * 8/2000 Bhatia .................... H01L 23/38
165/104.21
6,461,895 B1 * 10/2002 Liang ...................... G11C 7/02
257/E23.067
(Continued)

FOREIGN PATENT DOCUMENTS

DE    102009003934 A1    7/2010

OTHER PUBLICATIONS

International Search Report and Written Opinion for corresponding Application No. PCT/EP2014/064129, dated Sep. 24, 2014, 11 pages.

*Primary Examiner* — Robert J Hoffberg
(74) *Attorney, Agent, or Firm* — Brooks Kushman P.C.

(57) ABSTRACT

An electronic module is provided that includes a multilayer circuit board, and an electronic component, and a Peltier heat pump. The electronic component is mounted on a major surface of the multilayer circuit board and is electrically coupled to at least one memory die. The at least one memory die is at least partially embedded within the multilayer circuit board. The Peltier heat pump device has at least one pair of thermoelectric semiconductor members arranged thermally in parallel and electrically in series, and the at least one pair of semiconductor members are at least partially embedded in the circuit board.

20 Claims, 5 Drawing Sheets

(51) Int. Cl.
*H01L 23/538* (2006.01)
*H01L 25/16* (2006.01)
*H05K 1/02* (2006.01)
*H05K 1/11* (2006.01)
*H01L 23/00* (2006.01)

(52) U.S. Cl.
CPC ...... *H01L 23/5384* (2013.01); *H01L 23/5389* (2013.01); *H01L 24/19* (2013.01); *H01L 25/16* (2013.01); *H05K 1/0203* (2013.01); *H05K 1/0298* (2013.01); *H05K 1/115* (2013.01); *H05K 1/181* (2013.01); *H05K 1/183* (2013.01); *H01L 2224/04105* (2013.01); *H01L 2224/16225* (2013.01); *H01L 2224/73267* (2013.01); *H01L 2924/15153* (2013.01); *H05K 2201/10159* (2013.01); *H05K 2201/10219* (2013.01); *H05K 2201/10734* (2013.01); *Y02P 70/611* (2015.11)

(56) References Cited

U.S. PATENT DOCUMENTS

| | | | | |
|---|---|---|---|---|
| 7,250,327 | B2* | 7/2007 | Sakamoto | H01L 23/38 257/706 |
| 7,299,639 | B2* | 11/2007 | Leija | H01L 23/38 257/E23.082 |
| 7,537,954 | B2* | 5/2009 | Ramanathan | H01L 23/38 438/108 |
| 8,022,533 | B2* | 9/2011 | Usui | H01L 23/142 257/706 |
| 8,319,331 | B2* | 11/2012 | Ibaraki | H01L 23/147 257/693 |
| 9,228,763 | B2* | 1/2016 | Kim | F25B 21/02 |
| 9,516,790 | B2* | 12/2016 | Noshadi | H05K 7/205 |
| 2003/0057544 | A1 | 3/2003 | Nathan et al. | |
| 2006/0170098 | A1 | 8/2006 | Hsu | |
| 2006/0179849 | A1 | 8/2006 | Abramov et al. | |
| 2007/0232050 | A1 | 10/2007 | Toyama et al. | |
| 2010/0219525 | A1* | 9/2010 | Ibaraki | H01L 23/147 257/693 |
| 2016/0084542 | A1* | 3/2016 | Kim | F25B 21/02 62/3.7 |
| 2016/0343929 | A1* | 11/2016 | Yu | H01L 24/17 |

* cited by examiner

ELECTRONIC MODULE

CROSS-REFERENCE TO RELATED APPLICATION

This application is the U.S. national phase of PCT Application No. PCT/EP2014/064129 filed on 03 Jul. 2014, which claims priority to EP Application No. 13178585.9 filed on 30 Jul. 2013, the disclosures of which are incorporated in their entirety by reference herein.

TECHNICAL FIELD

The disclosure relates to an electronic module for automotive applications.

BACKGROUND

An electronic module may comprise two or more electronic components and electrical connections that are arranged to provide a desired circuit or functionality. For example, an electronic module may comprise a processor chip and a memory chip that are mounted on a common circuit board. The circuit board includes electrically conductive traces that may provide at least part of the electrical connections between the processor chip and the memory chip and an electrically conductive redistribution structure from the outer contacts of the module to the chips. The chips may be provided as separate packages or components that are mounted on the circuit board by outer contacts of the package, such as solder balls, lands or pins. In some applications, a cavity is provided in a surface of the printed circuit board and a component is mounted in the cavity. However, mounting arrangements suitable for electronic modules are desirable.

SUMMARY

An electronic module is provided that includes a multilayer circuit board, an electronic component, and a Peltier heat pump. The electronic component is mounted on a major surface of the multilayer circuit board and is electrically coupled to at least one memory die. The at least one memory die is at least partially embedded within the multilayer circuit board. The Peltier heat pump device has at least one pair of thermoelectric semiconductor members arranged thermally in parallel and electrically in series, and the at least one pair of semiconductor members are at least partially embedded in the circuit board.

Other systems, methods, features and advantages will be, or will become, apparent to one with skill in the art upon examination of the following figures and detailed description. It is intended that all such additional systems, methods, features and advantages be included within this description, be within the scope of the invention and be protected by the following claims.

BRIEF DESCRIPTION OF THE DRAWINGS

The system may be better understood with reference to the following description in connection with the drawings. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
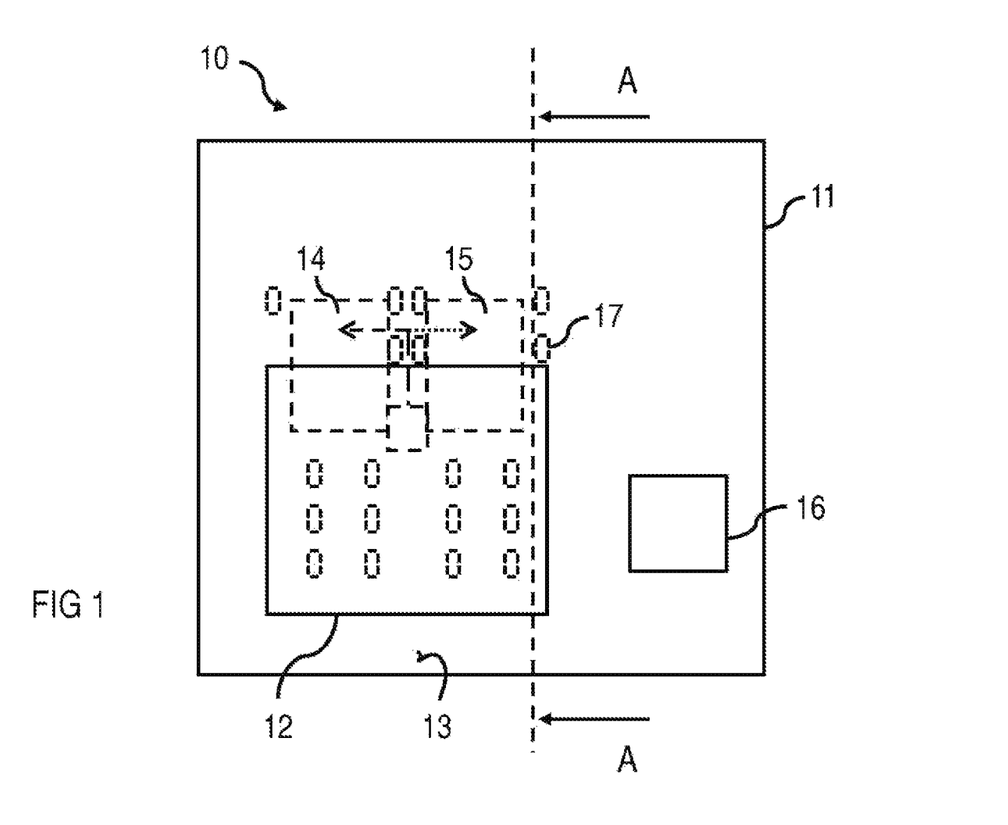
FIG. 1 is a schematic diagram illustrating a top view of a first exemplary electronic module.
Figure 2:
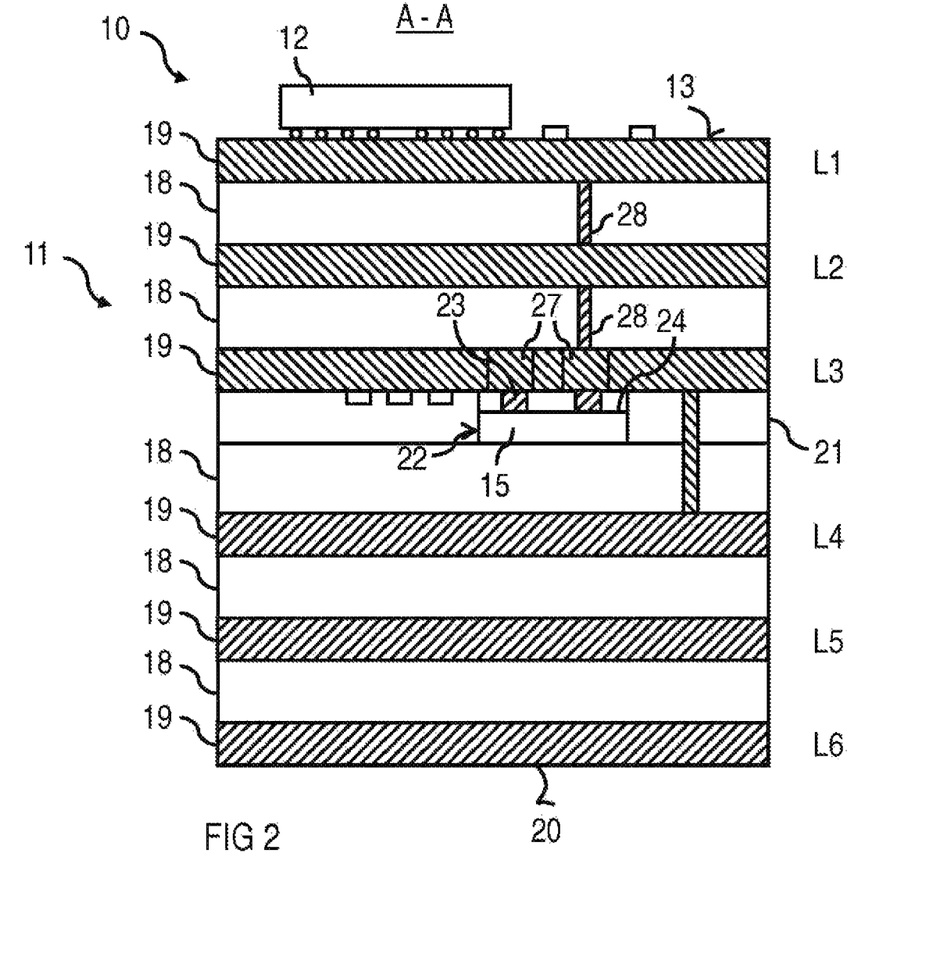
FIG. 2 is a schematic diagram illustrating a cross-sectional view of the electronic module of FIG. 1 along line A-A.

FIG. 1 illustrates a top view of an exemplary electronic module 10; FIG. 2 illustrates a cross-sectional view of electronic module 10 along line A-A. Electronic module 10 includes multilayer circuit board 11, electronic component 12 mounted on major surface 13 of multilayer circuit board 11 and the two memory dies 14 and 15. The two memory dies 14 and 15 are embedded, at least partially, within multilayer circuit board 11, and are therefore represented in the top view of FIG. 1 by dashed lines.

In exemplary arrangements in which portions of memory dies 14 and 15 are partially exposed from circuit board 11, they may be described as being partially embedded within circuit board 11. In exemplary arrangements in which no portion of memory dies 14 and 15 is exposed from circuit board 11, they may be described as being entirely embedded within circuit board 11. In other exemplary arrangements, memory banks, which may include, for example, 1-8 memory devices, may be connected via (e.g., 16-128) bit lines to the circuit board.

Electronic component 12 may have a system-on-chip architecture (SoC), or may include a processor such as a central processing unit (CPU), graphics processing unit (GPU) or microcontroller, or may be a freely programmable gate array (FPGA) or application-specific integrated circuit (ASIC). The memory dies may be double data rate random access memory (DDR RAM) dies such as DDR2, DDR3, DDR4 and LPDDR3 RAM memory dies. Memory dies 14 and 15 may be provided as unpackaged or bare dies as multilayer circuit board 11 may be used to provide a package function since memory dies 14 and 15 are at least partially embedded within multilayer circuit board 11.

Electronic module 10 further includes nonvolatile memory 16, which, in this exemplary electronic module, may be provided in the form of a packaged NOR (not OR) chip. Nonvolatile memory 16 is mounted on major surface 13 of multilayer circuit board 11, adjacent to electronic component 12. Further components of electronic module 10, such as capacitor 17, are also mounted on the first major surface 13 of multilayer circuit board 11. Electronic component 12 is electrically coupled to memory dies 14 and 15 and further components by an electrically conductive redistribution structure. Electronic module 10 may be used for automotive applications such as a head-up display.

As is illustrated in the top view of FIG. 1, the two memory dies 14 and 15 are arranged parallel to one another and partially underneath electronic component 12 so that they extend adjacent to one side of electronic component 12. This arrangement of memory dies 14 and 15 within circuit board 11 and beneath electronic component 12 may be used to decrease the lateral size of multilayer circuit board 11 and/or electronic module 10 as space on the upper surface of multilayer circuit board 11 is no longer required for the memory component(s).

In other non-illustrated embodiments, electronic component 12 may be coupled to a single memory die or two or more memory dies. The memory dies may have an arrangement differing from that illustrated in FIG. 1. For example, the memory dies may be positioned entirely beneath the electronic component or beneath other components mounted on the upper surface of the multilayer circuit board. In the case of two or more memory dies, the dies may be stacked one above the other, with the stack embedded at least partially within the multilayer circuit board.

FIG. 2 illustrates a cross-sectional view of the first exemplary electronic component 10 taken along line A-A in FIG. 1. Multilayer circuit board 11 includes a plurality of insulation layers 18 interleaved by electrically conductive layers 19. An insulation layer is electrically insulating and may comprise a dielectric material. Insulation layers 18 may comprise epoxy-resin-impregnated glass fibers, for example. Electrically conductive layers 19 may be formed from a metallic foil such as a copper foil.

Multilayer circuit board 11 may include six (or more) electrically conductive layers 19, indicated in FIG. 2 as L1, L2, L3, L4, L5 and L6, each of which is separated from its neighbor by an insulation layer 18. Electrically conductive layers 19 may comprise a plurality of electrically conductive traces that act as electrical connections between the electronic component 12 and other components mounted on the first major surface 13 of the multilayer circuit board 11, the memory dies, of which one memory die 15 is illustrated in the cross-sectional view of FIG. 2, and/or outer contacts of the electronic module 10 which are positioned on the opposing major surface 20 of the multilayer circuit board 11. The electrically conductive traces may be formed by structuring the metallic foil forming the electrically conductive layer 19.

As is illustrated in the cross-sectional view of FIG. 2, memory die 15 is positioned partially beneath electronic component 12 and is embedded entirely within multilayer circuit board 11. Memory die 15 is embedded within insulation layer 21, which is sandwiched between electrically conductive layers L3 and L4 within the body of the multilayer circuit board. Insulation layer 21 includes cavity 22, which has a size configured to accommodate memory die 15 within its volume.

Cavity 22, in which memory die 15 is mounted, may be filled with an encapsulant (for example, an epoxy resin), which may embed upper surface 24 of memory die 15 and/or the side faces of memory die 15. Memory die 15 may be mounted in cavity 22 by means of an adhesive layer, or the encapsulation may also act as an adhesive to secure memory die 15 in cavity 22.

The first memory die 14 may be mounted in the same cavity as the second memory die 15 or in a separate cavity.

Memory die 15 includes contact pads 23 on its upper surface 24 that are electrically connected by contact bumps to traces 27 of electrically conductive layer L3. These electrically conductive traces 27 are coupled to electronic component 12 by electrically conductive vias 28, which extend through the two insulation layers 18 positioned between memory die 15 and electronic component 12, and by further conductive traces 27 of electrically conductive layers L1 and L2.

Electrically conductive traces 27 and electrically conductive vias 28 provide a three-dimensional redistribution structure in multilayer circuit board 11. This three-dimensional redistribution structure is used to electrically couple components 12, 14, 15 and 17, providing the desired circuit or function of electronic module 10, and to couple components 12, 14, 15 and 17 to outer contacts of the electronic module, including power supply contacts and signal contacts.

Memory die 15 may be mounted in cavity 22 in other arrangements. For example, electrically conductive traces may be provided on the base of the cavity, and the memory die may be mounted on them. These electrically conductive traces are used to couple the memory die to the redistribution structure of the multilayer circuit board.

Electronic module 10 may be produced by producing a subassembly that includes multilayer circuit board 11, memory dies 14 and 15 embedded within multilayer circuit board 11 and a suitable arrangement of contact pads, electrically conductive traces in the electrically conductive layers L1, L2, L3, L4, L5 and L6 and electrically conductive vias to provide a suitable redistribution structure for a desired circuit. Electronic component 12 and further components such as nonvolatile memory 16 and capacitor 17 may then be mounted on the subassembly with the integrated memory dies 14 and 15 to form electronic module 10.

By placing memory dies 14 and 15 within multilayer circuit board 11, in particular beneath electronic component 12, the length of the electrically conductive connections between memory dies 14 and 15 and electronic component 12 may be reduced over arrangements in which the memory dies are mounted adjacent to electronic component 12 on the first major surface 13 of multilayer circuit board 11. By reducing the length of the electrically conductive connections, the spacing between neighboring electrically conductive traces can be reduced whilst the level of crosstalk is maintained or even reduced. The electrically conductive traces may be formed using printed circuit board technology, for example, which may also enable the spacing of the traces to be decreased, particularly at the inner electrically conductive layers 19 of multilayer circuit board 11, such as layers L2, L3, L4 and L5.

A blocking capacitor may be mounted directly adjacent to the contacts of electronic component 12. The power connections of memory dies 14 and 15 may be connected at low inductive power to a ground plane of multilayer circuit board 11 without additional package capacity since bare, unpackaged memory dies are used without bonding wire inductance, as electrically conductive traces are used. Additionally, impedance matching at the address/command/data lines can be improved and reflections can be reduced since the capacitance associated with pins or outer connections of the memory die package and bonding wire inductance are avoided. This may be used to eliminate on-die termination, which may in turn reduce power consumption.

These factors may be used to enable the use of memory with a larger bandwidth, such as DDR4 memory dies, in automotive applications such as infotainment head units, infotainment combinations, instrument clusters or head-up displays. Furthermore, these factors can lead to a reduction in space requirements, which may be useful to provide more space for cooling and airflow and an easier arrangement of the module inside a further component such as an infotainment head unit, infotainment combination, instrument cluster or head-up display.

Figure 3:
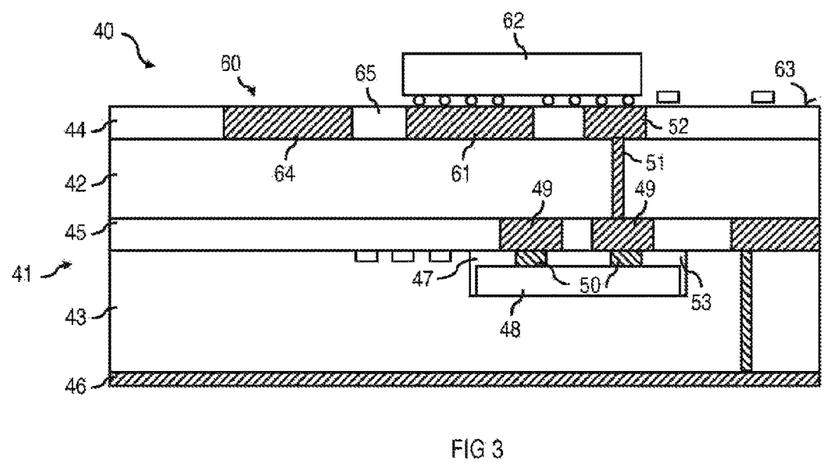
FIG. 3 is a schematic diagram illustrating a cross-sectional view of a second exemplary electronic module.

FIG. 3 illustrates a side view of a second exemplary electronic module 40, which includes multilayer circuit board 41 (including upper insulation layer 42 and lower insulation layer 43) and three electrically conductive layers 44, 45 and 46. Upper insulation layer 42 is sandwiched between the first electrically conductive layer 44 and the second electrically conductive layer 45; lower insulation layer 43 is sandwiched between the second electrically conductive layer 45 and the third electrically conductive layer 46. Lower insulation layer 43 includes cavity 47 in its upper region. Memory die 48 is mounted within cavity 47 and is electrically connected to electrically conductive traces 49 in the second electrically conductive layer 45 by contact bumps 50. Electrically conductive traces 49 may be electrically connected to one or more electrically conductive vias 51 in upper insulation layer 42, which are in turn electrically connected to traces 52 in electrically conductive layer 44. Cavity 47 is filled with encapsulant in the form of epoxy resin 53. Memory die 48 is embedded within the volume of multilayer circuit board 41.

Multilayer circuit board 41 further comprises Peltier heat pump device 60, which is also embedded in multilayer circuit board 41 and, more specifically, in the first electrically conductive layer 44.

A Peltier heat pump device is a device that is able to use electrical energy to pump heat and may be used to provide cooling and/or heating depending on the direction of the applied current. Peltier heat pumps make use of the Peltier effect to create a heat flux between the junction of two different types of semiconductor materials that display a thermoelectric effect. For example, a first semiconductor member may have a first conductivity type, and a second semiconductor member have a second conductivity type that opposes the first conductivity type. The two semiconductor members are arranged in a spatially alternating fashion, and are arranged thermally in parallel and electrically in series. Various classes of semiconductor materials appropriate for thermoelectric elements are known, including, without limitation, $Bi_2Te_3$, $Bi_{2-x}Sb_xTe_3$, PbTe—PbS-based materials and half-Heusler compounds that have an MgAgAs structure.

Peltier heat pump device 60 includes a first heater/cooler surface 61, which is positioned underneath heat-generating device 62 mounted on upper surface 63 of multilayer circuit board 41. Heat-generating device 62 may be, for example, a processor chip or SoC package. Peltier heat pump device 60 further includes a second heater/cooler surface 64 and semiconductor members 65, which exhibit a thermoelectric effect. The second heater/cooler surface 64 is positioned adjacent to the first heater/cooler surface 61. The first heater/cooler surface 61 and the second heater/cooler surface 64 may be formed from portions of the first electrically conductive layer 44, which is provided as part of multilayer circuit board 41.

The first heater/cooler surface 61 is arranged beneath heat-generating device 62 in the uppermost layer 44 of multilayer circuit board 40, and memory die 45 is arranged beneath heat-generating device 62 and beneath Peltier heat pump device 60 in a lower layer 43 of multilayer circuit board 40. Heat-generating device 62, Peltier heat pump device 60 and memory die 45 have a stacked arrangement. This stacked arrangement may be used to enable the lateral sizes of the multilayer circuit board 40 and electronic component 62 to be reduced.

Figure 4:
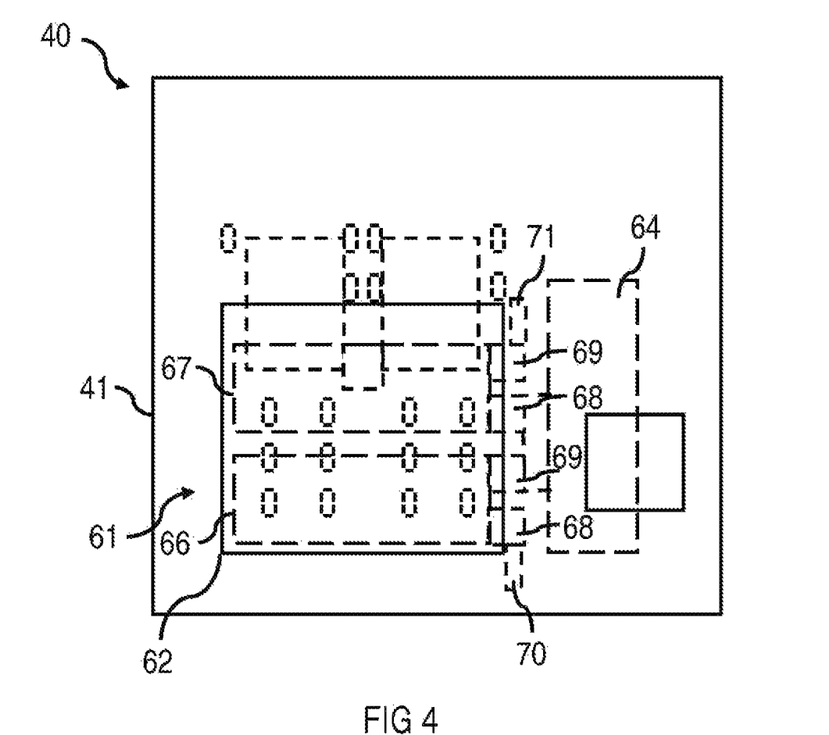
FIG. 4 is a schematic diagram illustrating a top view of the electronic module of FIG. 3.
Figure 5:
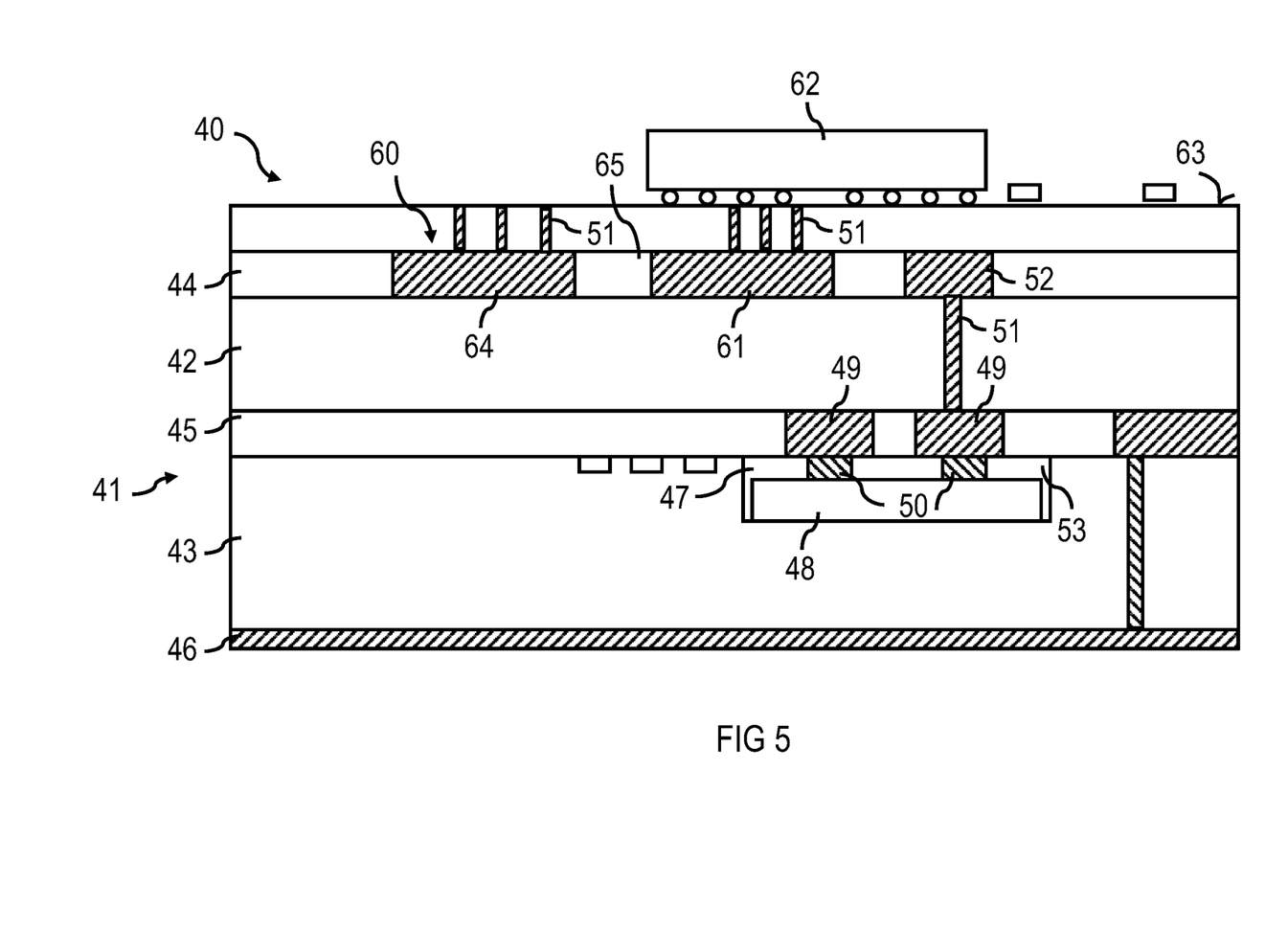
FIG. 5 depicts a schematic diagram illustrating one embodiment of the electronic module.

The arrangement of Peltier heat pump device 60 is also illustrated in the top view of FIG. 4. As is illustrated, the first heater/cooler surface 61 includes two separate portions 66 and 67, which are positioned underneath heat-generating component 62. A pair of semiconductor members of opposing conductivity types 68 and 69 extends from each of the first heater/cooler portions 66 and 67. Semiconductor member 69 of the second conductivity type extending from the first heater/cooler portion 66 is electrically connected to semiconductor member 69 of the first conductivity type extending from the second heater/cooler portion 67 by the second heater/cooler surface 64. The semiconductor members 68 and 69 of a pair are arranged thermally in parallel and electrically in series.

Peltier heat pump device 60 has a first contact 70 extending from the first semiconductor member 68 of the first heater/cooler portion 66; it also has a second contact 71 extending from the second semiconductor member 69 of the second portion 67 of the first heater/cooler surface 61. A current is supplied to contacts 70 and 71 of Peltier heat pump device 60 in order to produce a temperature gradient and a heat transfer between the first heater/cooler surface 61 and the second heater/cooler surface 64.

The direction of the current applied to Peltier heat pump device 60 may be selected so that the first heater/cooler surface 61 provides cooling for electronic device 62 and the second heater/cooler surface 64 provides a hot surface for dissipating heat removed from electronic device 62. Peltier heat pump device 60 may provide heating to electronic device 62 via the first heater/cooler surface 61 by reversing the direction of current applied to contacts 70 and 71.

In the exemplary arrangement illustrated in FIGS. 3 and 4, Peltier heat pump device 60 includes two pairs of semiconductor members 68 and 69, two first heater/cooler portions 66 and 67 and a single second heater/cooler surface 64. However, Peltier heat pump device 60 is not limited to this particular arrangement and may include three or more first heater/cooler portions, three or more pairs of semiconductor members and two or more second heater/cooler portions, all of which arranged so that the semiconductor members of each pair are arranged thermally in parallel and electrically in series.

In this exemplary arrangement, the first heater/cooler surface 61, semiconductor members 68 and 69 and second heater/cooler surface 64 are generally coplanar. In further non-illustrated exemplary arrangements, the second heater/cooler surface may be spaced at a distance vertically from the first heater/cooler surface. In a further non-illustrated exemplary arrangement, the first heater/cooler surface and the second heater/cooler surface are embedded entirely within the multilayer circuit board. In these examples, the first heater/cooler surface may additionally be thermally coupled to the heat-generating electronic component by a plurality of thermally conductive vias, and the second heater/cooler surface may additionally be thermally coupled to the environment by a second plurality of thermally conductive vias.

Circuit board 41 may be produced by laminating a metallic foil (for example, a copper foil) onto insulation layer 42 to form a sub-layer. A metallic foil may be laminated onto both of the major surfaces of layer 43 to form a second sub-layer. Cavity 47 is formed in at least one of the insulation layers at a position suitable for accommodating one or more memory dies. The metallic layers are structured to produce a desired arrangement of electrically conductive traces 49. Through-holes are formed in insulation layers 42 and 43, and an electrically conductive material is inserted into the through-hole to form electrically conductive via 51. Memory die 48 is mounted into the cavity and electrically connected to electrically conductive traces 49 of the sub-layer. The sub-layers are then stacked and joined together to form a subassembly.

The further components, such as electronic component 62, are then mounted on upper surface 63 of the subassembly to form electronic module 40.

Peltier heat pump device 60 may be fabricated by structuring portions of a copper foil forming electrically conductive layer 44 to form the first and second heater/cooler surfaces 51 and 64 and contact areas 70 and 71. Semiconductor members 68 and 69 may be formed by screen-printing suitable semiconductor material onto insulation layer 42 between the first heater/cooler surface 51 and the second heater/cooler surface 64 to form an arrangement as described above.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. An electronic module for automotive applications, comprising:
    a multilayer circuit board;
    an electronic component mounted on a major surface of the multilayer circuit board and electrically coupled to at least one memory die, each of the at least one memory die being at least partially embedded within the multilayer circuit board; and
    at least one Peltier heat pump device, each of the at least one Peltier heat pump device including at least one pair of thermoelectric semiconductor members arranged thermally in parallel and electrically in series, each of the at least one pair of semiconductor members being at least partially embedded in the circuit board and disposed at least in part between the electronic component and one or more of the at least one memory die.

2. The electronic module of claim 1, wherein each of the at least one memory die is arranged at least partially beneath the electronic component.

3. The electronic module of claim 1, wherein the multilayer circuit board comprises a plurality of insulation layers, and a plurality of conductive layers comprising electrically conductive traces.

4. The electronic module of claim 3, wherein the multilayer circuit board further comprises at least one electrically conductive via, each of the at least one electrically conductive via extending through at least one insulation layer of the plurality of insulation layers.

5. The electronic module of claim 3, wherein each of the at least one memory die is coupled to the electronic component by the plurality of electrically conductive traces arranged in at least one of the conductive layers of the multilayer circuit board and at least one electrically conductive via extending through at least one insulation layer of the plurality of insulation layers.

6. The electronic module of claim 3, further comprising a cavity arranged in an insulation layer of the plurality of insulation layers, each of the at least one memory die being mounted in the cavity.

7. The electronic module of claim 6, further comprising an encapsulant arranged in the cavity, the encapsulant covering at least side faces of each of the at least one memory die.

8. The electronic module of claim 1, wherein the at least one pair of thermoelectric semiconductor members is at least two pairs of thermoelectric semiconductor members, each of the at least two pairs of thermoelectric semiconductor members comprises at least one first heater/cooler element and at least one second heater/cooler element, each of the at least two pairs of thermoelectric semiconductor members extending between a common one of the first heater/cooler element and a different one of the second heater/cooler element.

9. The electronic module of claim 8, wherein the common one of the first heater/cooler element is arranged laterally adjacent to the different one of the second heater/cooler element.

10. The electronic module of claim 1, wherein each of the at least one pair of semiconductor members is coplanar and arranged within the multilayer circuit board.

11. The electronic module of claim 1, wherein each of the at least one pair of semiconductor members extends between at least one first heater/cooler element and at least one second heater/cooler element, each of the at least one first heater/cooler element and each of the at least one second heater/cooler element are co-planar and spaced apart from one another.

12. The electronic module of claim 1, wherein each of the at least one pair of thermoelectric semiconductor members comprises at least one of the following:
    a first heater/cooler element embedded within the multilayer circuit board from which a plurality of thermally conductive vias extends to the electronic component that should be cooled and/or heated, or
    a second heater/cooler element embedded within the multilayer circuit board from which a plurality of thermally conductive vias extend to an outer surface of the multilayer circuit board.

13. The electronic module of claim 1, wherein the electronic component comprises a system-on-chip architecture, and the memory die is a double data rate random access memory type memory chip.

14. The electronic module of claim 1, wherein the electronic component includes one of a system-on-chip architecture (SoC), a processor, a freely programmable gate array (FPGA), and an application-specific integrated circuit (ASIC).

15. An electronic module for automotive applications, comprising:
    an electronic component mounted on a multilayer circuit board and electrically coupled to at least one memory die, each of the at least one memory die being at least partially embedded within the multilayer circuit board; and
    at least one Peltier heat pump device, each of the at least one Peltier heat pump device including at least one pair of thermoelectric semiconductor members arranged thermally in parallel and electrically in series, each of the at least one pair of semiconductor members being at least partially embedded within the multilayer circuit board and disposed at least in part between the electronic component and one or more of the at least one memory die.

16. The electronic module of claim 15, wherein each of the at least one memory die is arranged at least partially beneath the electronic component.

17. The electronic module of claim 15, wherein the multilayer circuit board comprises a plurality of insulation layers, and a plurality of conductive layers comprising electrically conductive traces.

18. The electronic module of claim 17, wherein the multilayer circuit board further comprising at least one electrically conductive via, each of the at least one electrically conductive via extending through at least one insulation layer of the plurality of insulation layers.

19. The electronic module of claim 17, wherein each of the at least one memory die is coupled to the electronic component by the plurality of electrically conductive traces arranged in at least one of the conductive layers of the multilayer circuit board and at least one electrically conductive via extending through at least one insulation layer of the plurality of insulation layers.

20. An electronic module for automotive applications, comprising:
    a multilayer circuit board;
    an electronic component mounted on the multilayer circuit board and electrically coupled to at least one memory die, the at least one memory die being at least partially embedded within the multilayer circuit board; and
    at least one heat pump device, each of at least one heat pump device including at least one pair of thermoelectric semiconductor members arranged thermally in parallel and electrically in series, each of the at least one pair of semiconductor members being at least partially embedded within the multilayer circuit board and disposed at least in part between the electronic component and one or more of the at least one memory die.

* * * * *